US009653306B2

(12) United States Patent
Shimoda et al.

(10) Patent No.: US 9,653,306 B2
(45) Date of Patent: May 16, 2017

(54) METHOD FOR FORMING CRYSTALLINE COBALT SILICIDE FILM

(75) Inventors: Tatsuya Shimoda, Nomi (JP); Yasuo Matsuki, Tokyo (JP); Ryo Kawajiri, Nomi (JP)

(73) Assignees: JAPAN SCIENCE AND TECHNOLOGY AGENCY, Kawaguchi-shi (JP); JSR CORPORATION, Tokyo (JP)

( * ) Notice: Subject to any disclaimer, the term of this patent is extended or adjusted under 35 U.S.C. 154(b) by 258 days.

(21) Appl. No.: 13/518,986

(22) PCT Filed: Dec. 22, 2010

(86) PCT No.: PCT/JP2010/073847
§ 371 (c)(1),
(2), (4) Date: Aug. 15, 2012

(87) PCT Pub. No.: WO2011/078399
PCT Pub. Date: Jun. 30, 2011

(65) Prior Publication Data
US 2012/0301731 A1 Nov. 29, 2012

(30) Foreign Application Priority Data
Dec. 25, 2009 (JP) ................................ 2009-295450

(51) Int. Cl.
*B05D 3/02* (2006.01)
*H01L 21/285* (2006.01)
(Continued)

(52) U.S. Cl.
CPC ...... *H01L 21/28518* (2013.01); *H01L 21/288* (2013.01); *H01L 21/28052* (2013.01); *H01L 29/665* (2013.01)

(58) Field of Classification Search
CPC .................................... H01L 21/28518
See application file for complete search history.

(56) References Cited

U.S. PATENT DOCUMENTS 4,324,854 A * 4/1982 Beauchamp et al. ......... 430/296
4,814,294 A * 3/1989 West et al. .................... 438/606
(Continued)

FOREIGN PATENT DOCUMENTS

JP          59 169127          9/1984
JP          59-169127 A        9/1984
(Continued)

OTHER PUBLICATIONS

Lee et al. "Deposition Characteristics of Co Thin Films Over High Aspect Ratio Trenches by MOCVD Using Co2(Co)8 as a Precursor", Journal of the Korean Physical Society, vol. 49, Dec. 2006, pp. S697-S701.*

(Continued)

*Primary Examiner* — Tabatha Penny
(74) *Attorney, Agent, or Firm* — Oblon, McClelland, Maier & Neustadt, L.L.P.

(57) ABSTRACT

The present invention is directed to a method for forming a crystalline cobalt silicide film, comprising the steps of:
applying to a surface made of silicon a composition obtained by mixing a compound represented by the following formula (1A) or (1B):

$$Si_nX_{2n+2} \quad (1A)$$

$$Si_mX_{2m} \quad (1B)$$

wherein each X in the formulas (1A) and (1B) is a hydrogen atom or a halogen atom, n is an integer of 1 to 10, and m is an integer of 3 to 10, or a polymer thereof with a zero-valent cobalt complex to form a coating film;

(Continued)

a TEM image of a cross section (magnification of 50,000 times)

a TEM image of a cross section (magnification of 500,000 times)

heating the coated film at 550 to 900° C. so as to form a two-layer film which is composed of a first layer made of a crystalline cobalt silicide on the surface made of silicon and a second layer containing silicon atoms, oxygen atoms, carbon atoms and cobalt atoms on the first layer; and removing the second layer of the two-layer film.

16 Claims, 7 Drawing Sheets

(51) Int. Cl.
    *H01L 21/288*     (2006.01)
    *H01L 21/28*     (2006.01)
    *H01L 29/66*     (2006.01)

(56) References Cited

U.S. PATENT DOCUMENTS

| | | | | |
|---|---|---|---|---|
| 5,700,400 | A * | 12/1997 | Ikai | C08G 77/60 252/512 |
| 6,251,777 | B1 * | 6/2001 | Jeng et al. | 438/682 |
| 6,753,245 | B2 * | 6/2004 | Choi | 438/613 |
| 6,797,602 | B1 * | 9/2004 | Kluth et al. | 438/592 |
| 6,846,513 | B2 * | 1/2005 | Furusawa | B82Y 30/00 427/248.1 |
| 2002/0008486 | A1 * | 1/2002 | Yabe | B60S 1/08 318/443 |
| 2002/0038889 | A1 * | 4/2002 | Yamazaki | H01L 27/12 257/347 |
| 2006/0246217 | A1 | 11/2006 | Weidman et al. | |
| 2006/0264043 | A1 | 11/2006 | Stewart et al. | |
| 2007/0077742 | A1 * | 4/2007 | Matsuki et al. | 438/592 |
| 2007/0087949 | A1 * | 4/2007 | Wu et al. | 510/175 |
| 2007/0099806 | A1 | 5/2007 | Stewart et al. | |
| 2007/0108404 | A1 | 5/2007 | Stewart et al. | |
| 2008/0254218 | A1 * | 10/2008 | Lei et al. | 427/248.1 |
| 2010/0107927 | A1 | 5/2010 | Stewart et al. | |

FOREIGN PATENT DOCUMENTS

| | | |
|---|---|---|
| JP | 8-116054 A | 5/1996 |
| JP | 2001-262058 A | 9/2001 |
| JP | 2003-313299 A | 11/2003 |
| JP | 2005 142540 | 6/2005 |
| JP | 2005-142540 A | 6/2005 |
| JP | 2008 60201 | 3/2008 |
| JP | 2008-60201 A | 3/2008 |
| JP | 2009 514238 | 4/2009 |
| WO | WO 2007/111679 A2 | 10/2007 |

OTHER PUBLICATIONS

Dormans et al. ("OMCVD of cobalt and cobalt silicide"), Journal of Crystal Growth, vol. 114, Issue 3, Nov. 1991, pp. 364-372, abstract only.*

International Search Report Issued Mar. 8, 2011 in PCT/JP10/073847 Filed Dec. 22, 2010.

Shyuichi Saitoh, et al., "Double heteroepitaxy in the Si (111)/CoSi$_2$/Si structure", Appl. Phys. Lett., 37(2), Jul. 15, 1980, pp. 202-205.

Alice E. White, et al., "Mesotaxy: Single-crystal growth of buried CoSi$_2$ layers", Appl. Phys. Lett., 50(2), Jan. 12, 1987, pp. 94-97.

International Preliminary Report on Patentability Issued Aug. 14, 2012 in PCT/JP10/73847 Filed Dec. 22, 2010.

* cited by examiner

Fig. 1
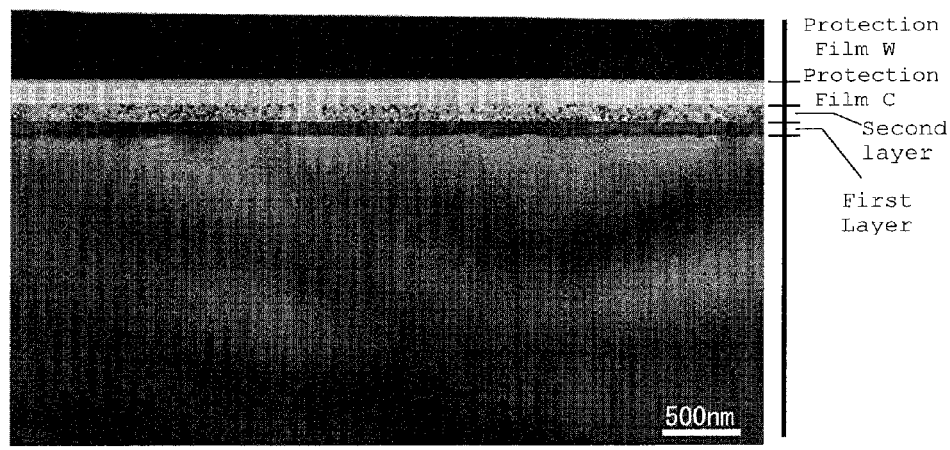
Fig. 1(a) a TEM image of a cross section (magnification of 50,000 times)
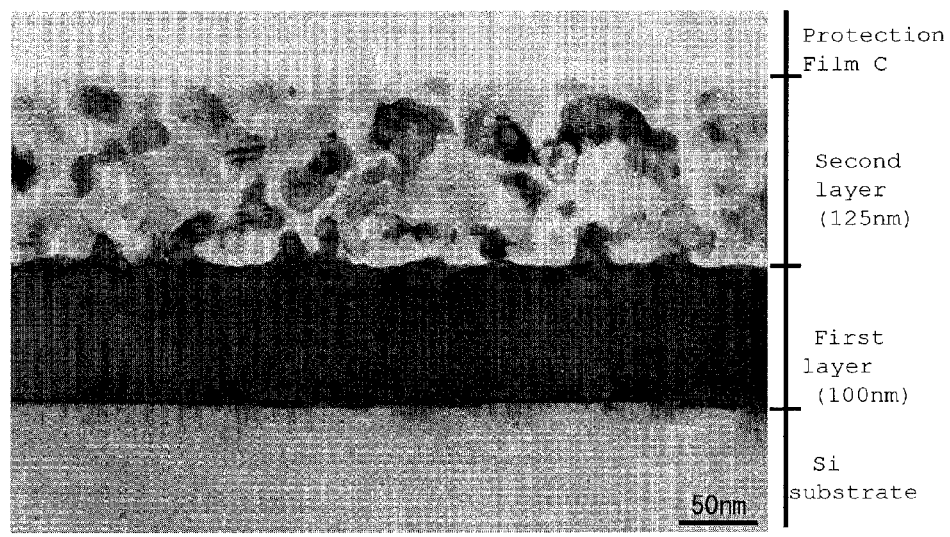
Fig. 1(b) a TEM image of a cross section (magnification of 500,000 times)

Fig. 2
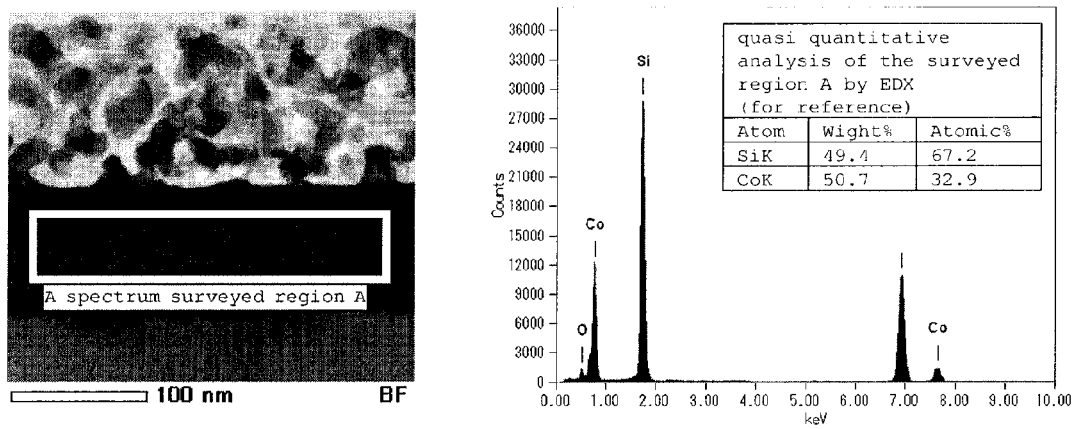
Fig.2 (a) an EDX spectrum of a first layer
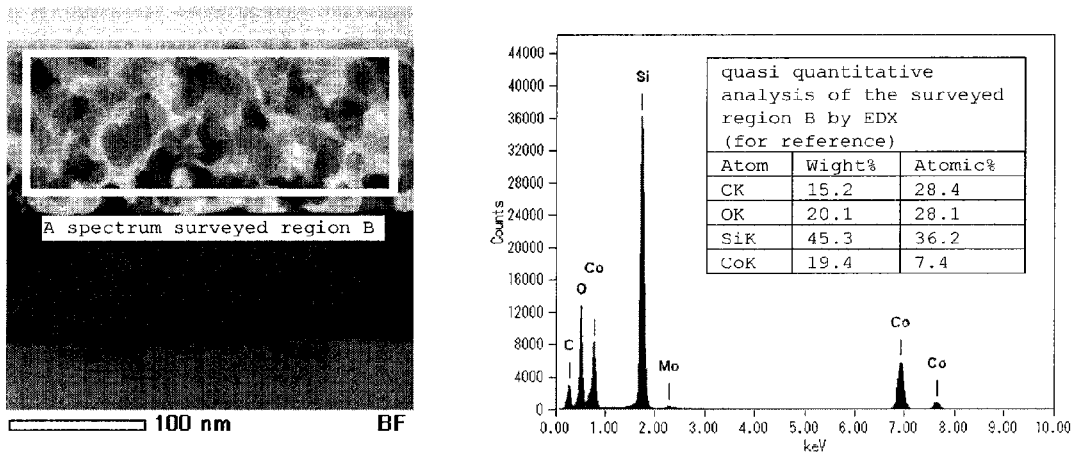
Fig.2 (b) an EDX spectrum of a second layer Fig. 3
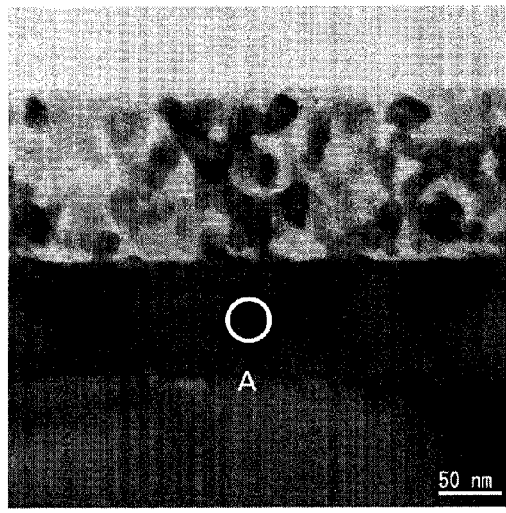 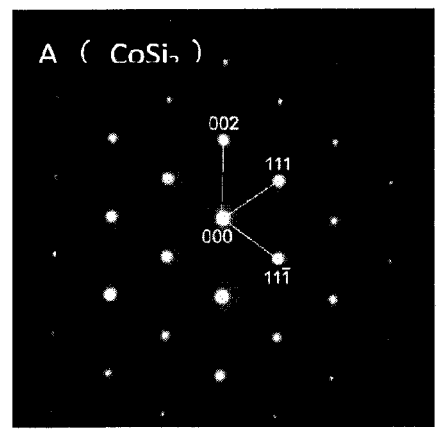
Fig. 3(a) electron diffraction image of a first layer
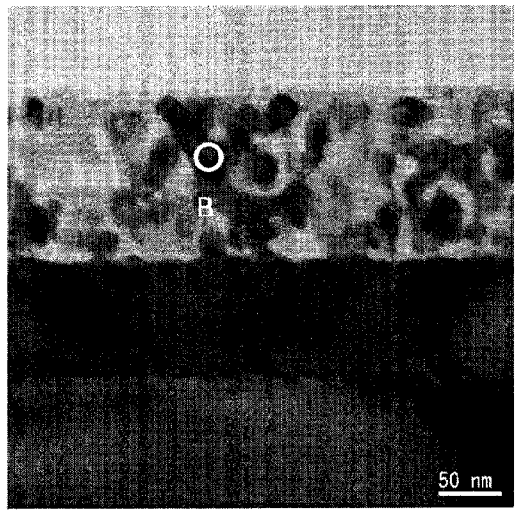 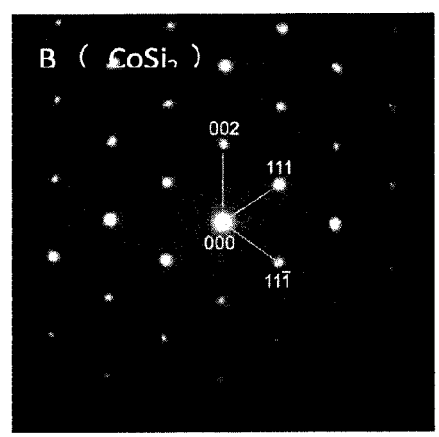
Fig. 3(b) electron diffraction image of a blackish portion of a second layer

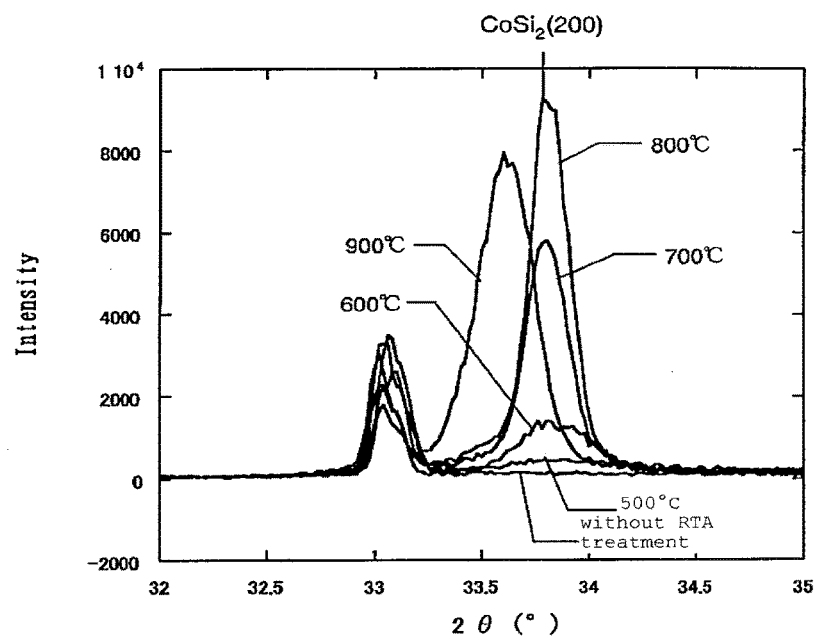
Fig. 4(a) an XRD chart of a first layer (2θ=32-35°)
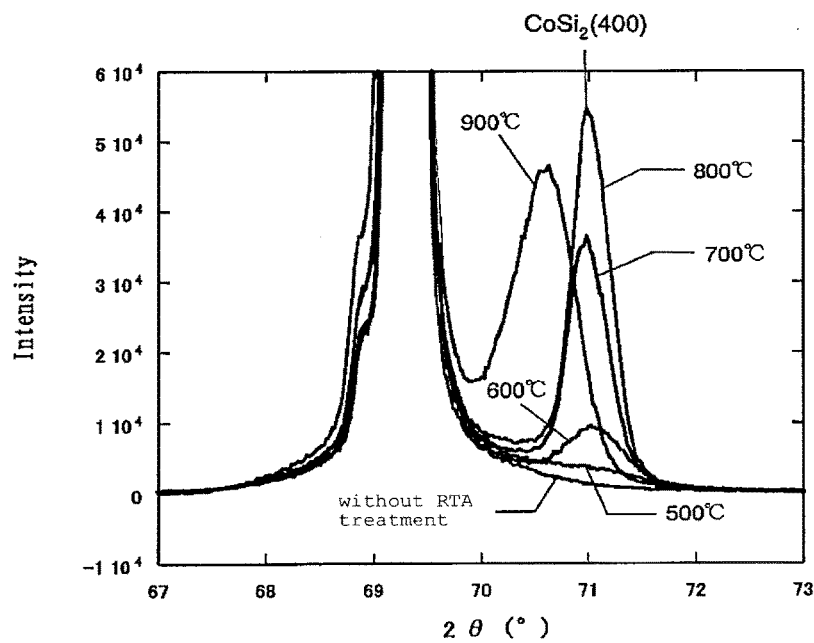
Fig. 4(b) an XRD chart of a first layer (2θ=67-73°)

Fig. 5
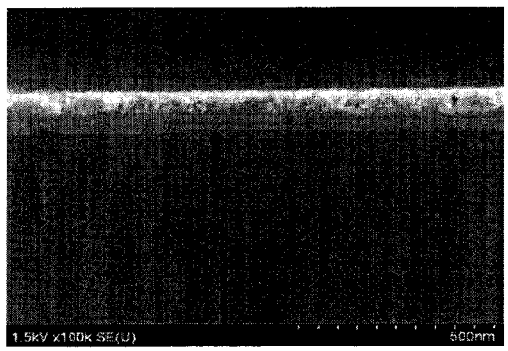
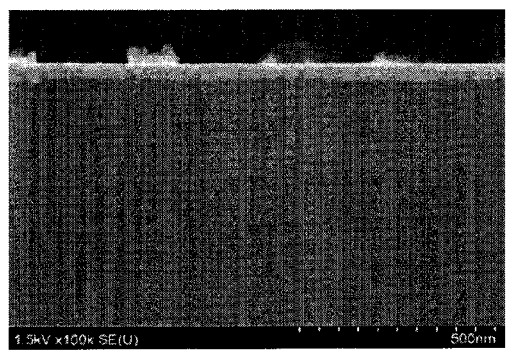
Fig. 5(a) A cross-sectional SEM image before CMP
Fig. 5(b) A cross-sectional SEM image after CMP
Fig. 6
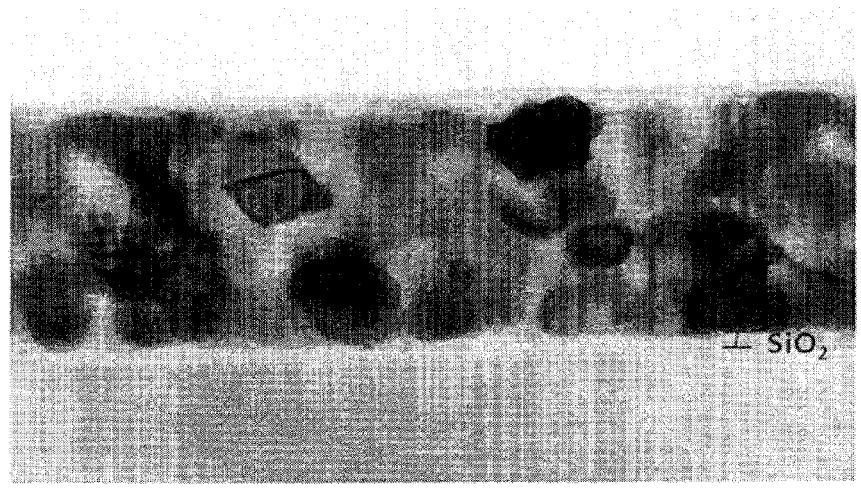
Fig. 6 A cross-section TEM image formed on a portion above the natural oxide film

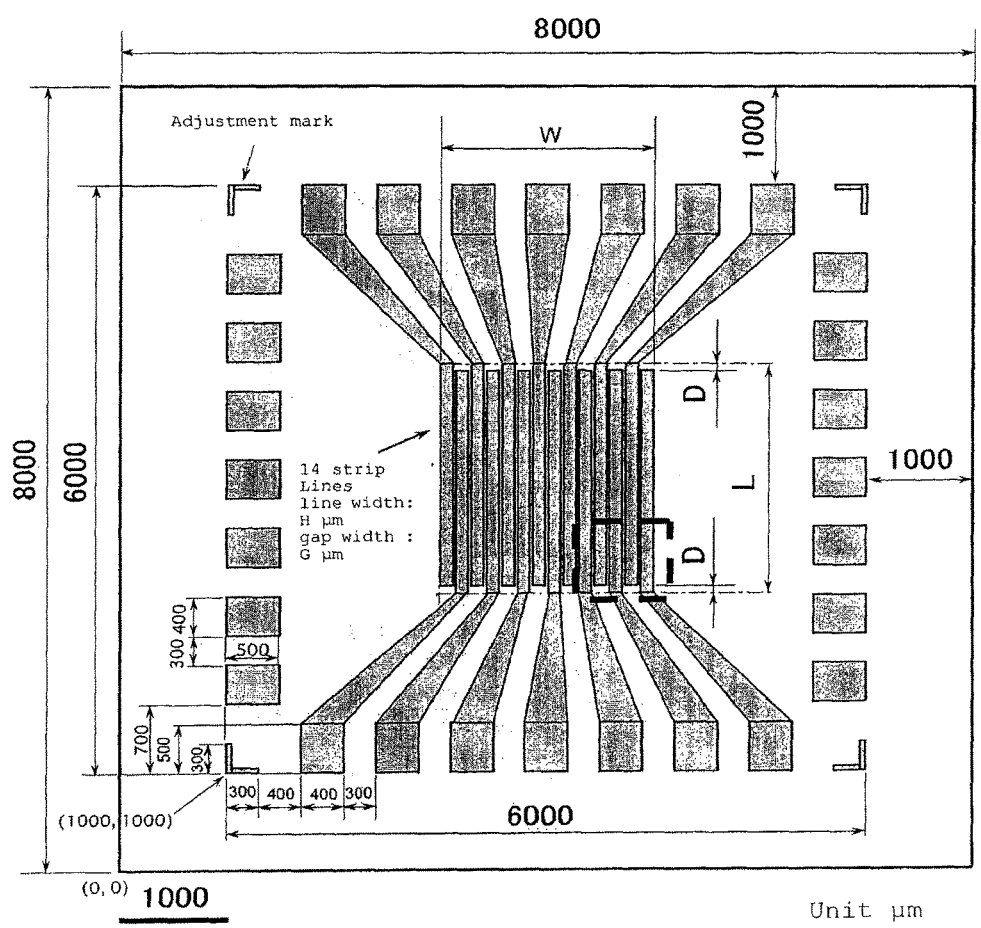
Fig. 7(a) a schimatic diagram of a resist pattern

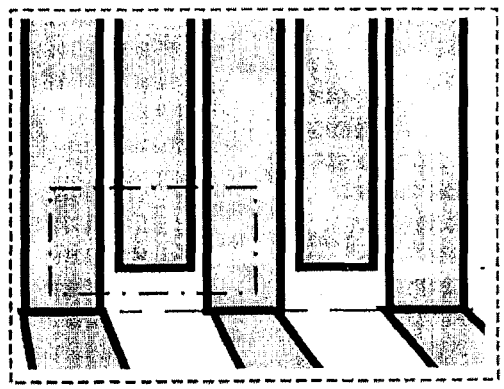
Fig. 7(b) a schimatic diagram of a resist pattern (a partially enlarged view of the region surrounded by the dashed line)
Fig. 8 an optical micrograph of a patterned film

METHOD FOR FORMING CRYSTALLINE COBALT SILICIDE FILM

This application is a National Stage of PCT/JP10/073847 filed Dec. 22, 2010 and claims the benefit of JP 2009-295450 filed Dec. 25, 2009.

TECHNICAL FIELD

The present invention primarily relates to a method for forming a crystalline cobalt silicide film, and secondarily relates to a method for forming a two-layer film produced during the process of forming the crystalline cobalt silicide film.

BACKGROUND ART

With high integration of semiconductor devices and miniaturization of patterns, it has been required to further lower resistance of gate electrodes. There is known, as a method for further lowering the resistance of gate electrodes, a method in which a gate electrode is silicided by a self-aligned silicide (SALICIDE) technique.

In the silicon semiconductor industry, there is often employed a method in which a surface of a silicon layer is modified with a silicide of other kinds of metals such as Co, Ni, Au, Ag, Ti, Pd and Al so as to form an ohmic contact by a work function of an interface between a wiring metallic material and silicon. It is known that a crystalline cobalt silicide is suitable as this silicide from the viewpoint of specific resistance of the silicide per se and matching of a lattice constant with silicon (JP 8-116054 A).

A process for forming a cobalt silicide is commonly carried out by a method in which a vacuum process is used in any step in the process. There are known, as a method for forming a cobalt silicide using a vacuum process, for example, a solid-phase growth method (S. Saitoh et al., Appl. Phys. Lett. 37, 203 (1980)), a molecular beam epitaxy method (J. C. Bean et al., Appl. Phys. Lett. 37, 643 (1980)), an ion implantation method (A. E. White et al., Appl. Phys. Lett. 50, 95 (1987)) and the like. However, all of these methods require a large-scale device for deposition of at least one of silicon and cobalt in a gas phase, and they have a problem of high production costs. Since particles and oxides are likely to be formed, it is difficult to form a coated film on a large-area substrate. Moreover, it is essential to use, as a raw material, a compound which is converted into a gas under vacuum. Therefore, the kind of a raw compound is restricted and a highly sealable vacuum device is required, resulting in higher production costs.

There has recently been reported a technique in which a liquid composition is applied on a substrate to form a coated film, and then the coated film is heated to form a cobalt-silicon alloy film (JP 2003-313299A). This technology is an excellent technology which can form a cobalt-silicon alloy film by a simple method without using a vacuum process. However, the cobalt-silicon alloy film formed by this technology is mainly intended to be used as a wiring material having arbitrary resistance, and crystallization of the film is not taken into consideration.

A method for forming a crystalline cobalt silicide in a simple manner, which can be employed as an electrode material in a semiconductor device and the like, is still unknown.

SUMMARY OF INVENTION

The present invention has been made in light of the above-mentioned circumstances, and an object thereof is to provide a method for forming a film made of a crystalline cobalt silicide in a simple manner.

Other objects and advantages of the present invention will become apparent from the following description.

According to the present invention, the above object of the present invention is achieved by a method for forming a crystalline cobalt silicide film, comprising the steps of:

applying to a surface made of silicon a composition obtained by mixing a compound represented by the following formula (1A) or (1B):

$$Si_nX_{2n+2} \tag{1A}$$

$$Si_mX_{2m} \tag{1B}$$

wherein each X in the formulas (1A) and (1B) is a hydrogen atom or a halogen atom, n is an integer of 1 to 10, and m is an integer of 3 to 10, or a polymer thereof with a zero-valent cobalt complex to form a coating film;

heating the coated film at 550 to 900° C. so as to form a two-layer film which is composed of a first layer made of a crystalline cobalt silicide on the surface made of silicon and a second layer containing silicon atoms, oxygen atoms, carbon atoms and cobalt atoms on the first layer; and removing the second layer of the two-layer film.

Also, the two-layer film per se is industrially useful since it is excellent in conductivity, and it can be used as various conductive films even in a state of a two-layer film without removal of the second layer.

BRIEF DESCRIPTION OF DRAWINGS

FIG. 1 is a TEM image of a cross section of a two-layer film formed on a silicon substrate in Example 1, in which FIG. 1(a) is an image at a magnification of 50,000 times and FIG. 1(b) is an image at a magnification of 500,000 times.

FIG. 2 is an EDX spectrum of a two-layer film formed on a silicon substrate in Example 1, in which FIG. 2(a) is an EDX spectrum of a first layer and FIG. 2(b) is an EDX spectrum of a second layer.

FIG. 3 is an electron diffraction image of a two-layer film formed on a silicon substrate in Example 1, in which FIG. 3(a) is an electron diffraction image of a first layer and FIG. 3(b) is an electron diffraction image of a blackish portion in a TEM image of a second layer.

FIG. 4 is an XRD chart of a first layer in a two-layer film formed on a silicon substrate at different heating temperatures in Example 4, in which FIG. 4(a) is a chart in a range of 2θ=32 to 35° and FIG. 4(b) is a chart in a range of 2θ=67 to 73°.

FIG. 5 is a cross-sectional SEM image before and after chemical mechanical polishing in Example 5, in which FIG. 5(a) is a cross-sectional SEM image before chemical mechanical polishing and FIG. 5(b) is a cross-sectional SEM image after chemical mechanical polishing.

FIG. 6 shows a cross-section TEM image of a film formed in Reference Example 1.

FIG. 7 is a resist pattern formed on a silicon substrate in Example 6, in which FIG. 7(a) is a view showing the whole region of a resist pattern and FIG. 7(b) is a partially enlarged view of the region surrounded by the dashed line in FIG. 7(a).

FIG. 8 is an optical micrograph of a patterned film formed in Example 6.

DESCRIPTION OF EMBODIMENTS

The present invention will be described in detail below.

<Surface Made of Silicon>

In the present invention, the surface made of silicon to which the below-mentioned composition is applied can include, for example, a surface of a silicon substrate, and may also be a surface of a silicon film formed on a substrate made of other materials. In the latter case, materials constituting the substrate include, for example, glasses, metals, plastics, ceramics and the like. Specific examples of these materials include glasses such as quartz glass, borosilicate glass, soda glass and lead glass; metals such as gold, silver, copper, nickel, aluminum, iron, and alloys containing these metals; and plastics such as polyimides and polyether sulfones. Known methods can be employed to form a silicon film on these substrates. For example, the film can be formed by a vacuum process such as a heat CVD method or a plasma CVD method, and a method using a liquid silicon precursor composition as disclosed, for example, in JP 2003-313299 A. The thickness of a silicon film formed on the substrate is preferably 5 nm or more.

As mentioned below, regarding the cobalt silicide in the first layer formed on a surface made of silicon by the method of the present invention, when the silicon of the lower layer has crystallinity, it undergoes crystal growth along its crystal direction. Accordingly, in order to form a highly crystallized cobalt silicide film, silicon having high crystallinity may be used as silicon of the lower layer. From such a viewpoint, the surface made of silicon is preferably a surface of single crystal silicon, and particularly preferably a surface of a single crystal silicon substrate.

<Composition>

In the present invention, a composition to be applied on the surface made of silicon as mentioned above is a composition obtained by mixing a compound represented by the above-mentioned formula (1A) or (1B) or a polymer thereof with a zero-valent cobalt complex.

As used herein, compounds represented by the formula (1A) (linear silane compounds) and compounds represented by the formula (1B) (cyclic silane compounds) as well as polymers obtained by polymerizing one or more kinds of these compounds (higher-order silane compounds) are collectively referred to as "silane compound" hereinafter.

As used herein, the term "composition obtained by mixing" means that the above composition includes, in addition to the case where it respectively contains a silane compound and a zero-valent cobalt complex, the case where it contains chemical species produced by the reaction of a silane compound with a zero-valent cobalt complex. It is well known that, when a silane compound is in contact with a cobalt complex, a reaction between these compounds gradually proceeds to form chemical species having a Si—Co bond. In the present invention, no effect of the present invention is impaired even if such a reaction arises after preparation of the composition, and a good-quality crystalline cobalt silicide film can be obtained even if a composition containing such chemical species is used as it is.

[Silane Compound]

Examples of each halogen atom represented by X in the formulas (1A) and (1B) include a chlorine atom, bromine atom and the like. X is preferably a hydrogen atom.

Specific examples of linear silane compounds represented by the formula (1A) include monosilane, disilane, trisilane, n-butasilane, n-pentasilane, iso-pentasilane, neo-pentasilane, n-hexasilane, n-heptasilane, n-octasilane, n-nonasilane, octachlorotrisilane, octabromotrisilane and the like. n in the above formula (1A) is preferably an integer of 3 to 9.

Specific examples of cyclic silane compounds represented by the formula (1B) include cyclotrisilane, cyclotetrasilane, cyclopentasilane, silylcyclotrisilane, silylcyclotetrasilane, silylcyclopentasilane, cyclohexasilane, cycloheptasilane, cyclooctasilane and the like. m in the formula (1B) is preferably an integer of 3 to 8.

Higher-order silane compounds in the present invention are polymers obtained by polymerizing one or more kinds of linear silane compounds represented by the formula (1A) and cyclic silane compounds represented by the formula (1B). Examples of the polymerization method thereof include photopolymerization, thermal polymerization and the like, and photopolymerization is preferably used. The photopolymerization can be carried out by irradiating one or more kind of the linear silane compounds and cyclic silane compounds with light. As light for irradiation, it is possible to use visible light, ultraviolet light, far-ultraviolet light; light from a low-pressure or high-pressure mercury lamp; deuterium lamp or discharge light of noble gases such as argon, krypton and xenon; and YAG laser, argon laser, carbon dioxide laser, excimer laser of XeF, XeCl, XeBr, KrF, KrCl, ArF, ArCl, and the like. These light sources preferably include light having a wavelength of 200 to 500 nm, and more preferably light having a wavelength of 254 to 420 nm. The output of these light sources is preferably from 10 to 5,000 W, and more preferably from 100 to 1,000 W. The light irradiation is carried out preferably at a temperature of room temperature to 300° C., preferably for about 0.1 to 30 minutes. The light irradiation is preferably carried out under a non-oxidizing atmosphere.

Regarding higher-order silane compounds, the polystyrene-equivalent polymerization average molecular weight measured by gel permeation chromatography is preferably from 500 to 500,000, and more preferably from 2,000 to 100,000.

Of the above silane compounds, silane compounds to be used in the present invention are preferably cyclic silane compounds represented by the formula (1B), more preferably compounds of the formula (1B) in which n is 5 or 6, still more preferably, at least one compound selected from the group consisting of cyclopentasilane, silylcyclopentasilane and cyclohexasilane, and particularly preferably cyclopentasilane.

[Zero-Valent Cobalt Complex]

Examples of the zero-valent cobalt complex contained in a composition to be applied on a surface made of silicon include complexes represented by each of the following formulas (2-1) to (2-4):

$$L^1_a Co(CO)_b \quad (2\text{-}1)$$

wherein $L^1$ in the formula (2-1) is a ligand selected from the group consisting of 1,3-cyclooctadiene, 1,4-cyclooctadiene, 1,5-cyclooctadiene, 1,3-butadiene, norbornadiene and allyl, a is 1 or 2, b is 0, 1, 2 or 4, and a+b is 2, 3, 4 or 5, and provided that when a is 2, two $L^1$(s) may be the same or different from each other;

$$L^2_c Co_2(CO)_d R_e \quad (2\text{-}2)$$

wherein $L^2$ in the formula (2-2) is a ligand selected from the group consisting of 1,3-cyclohexadiene, 1,4-cyclohexadiene, allyl, norbornadiene and cyclooctene, R is PhC:::CPh (::: means a triple bond), c is 0, 1, 2 or 4, d is 1, 2, 4, 6 or 8, e is 0, 1 or 2, and c+d+e is 4, 6, 7 or 8;

$$Co_3(CO)_{12} \quad (2\text{-}3)$$

$$Co_4(CO)_{12} \quad (2\text{-}4).$$

Specific examples of the zero-valent cobalt complex include complexes represented by the formula (2-1), such as 1,5-cyclooctadienedicarbonylcobalt, bis(1,5-cyclooctadiene)cobalt, bis(1,5-cyclooctadiene)carbonylcobalt, 1,3-cyclooctadienedicarbonylcobalt, bis(1,3-cyclooctadiene)cobalt, bis(1,3-cyclooctadiene)carbonylcobalt, η³-allyltricarbonylcobalt, and bis(η³-allyl)carbonylcobalt; and compounds represented by the formula (2-2), such as, for example, octacarbonyldicobalt, (norbornadiene)hexacarbonyldicobalt, cyclooctenehexacarbonyldicobalt and bis(norbornadiene)tetracarbonyldicobalt.

Of these complexes, an zero-valent cobalt complex to be used in the present invention is preferably at least one complex selected from the group consisting of bis(1,3-cyclooctadiene)cobalt, bis(1,5-cyclooctadiene)cobalt, (1,3-cyclooctadiene)dicarbonylcobalt, (1,5-cyclooctadiene)dicarbonylcobalt, η³-allyltricarbonylcobalt and octacarbonyldicobalt, and particularly preferably octacarbonyldicobalt.

[Ratio of Silane Compound to Zero-Valent Cobalt Complex]

Regarding a ratio of a silane compound to a zero-valent cobalt complex contained in a composition to be applied on a surface made of silicon, a ratio ($n_{Si}/n_{Co}$) of the number of silicon atoms ($n_{Si}$) contained in a silane compound to the number of cobalt atoms ($n_{Co}$) contained in a zero-valent cobalt complex is preferably from 0.5 to 4, more preferably from 0.6 to 2.5, and particularly preferably from 0.8 to 1.25.

[Composition]

Compositions to be applied on a surface made of silicon are preferably prepared as a composition in a solution state obtained by mixing the silane compound with the zero-valent cobalt complex in a suitable organic solvent.

Examples of the usable organic solvents include hydrocarbon compounds, ethers and the like. Examples of hydrocarbon compounds include aliphatic hydrocarbon compounds, alicyclic hydrocarbon compounds, aromatic hydrocarbon compounds and the like. Specific examples of these compounds include aliphatic hydrocarbon compounds such as n-pentane, cyclopentane, n-hexane, cyclohexane, n-heptane, n-octane, decane and squalane; alicyclic hydrocarbon compounds such as cycloheptane, cyclooctane, cyclodecane, hydrogenated products of dicyclopentadiene and decahydronaphthalene; and aromatic hydrocarbon compounds such as benzene, toluene, xylene, durene, indene and tetrahydronaphthalene. Examples of ethers include diethyl ether, dipropyl ether, dibutyl ether, ethyleneglycoldimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, tetrahydropyran, p-dioxane and the like. Of these compounds, hydrocarbon compounds are preferably used, and aromatic hydrocarbon compounds are more preferably used.

The concentration of the solid component of the composition to be applied on a surface made of silicon (proportion of the total weight of components other than solvents in the composition to overall weight of the composition) is preferably from 1 to 50% by weight, and more preferably from 10 to 30% by weight.

The composition thus prepared may be used to form a crystalline cobalt silicide film as it is, or after irradiation of the composition with light. The irradiation of the composition with light further improves applicability of the composition. For the light irradiation, it is possible to use the same conditions as in light irradiation in photopolymerization in case of synthesizing a higher-order silane compound, except that a light source including light having a wavelength of 170 to 600 nm can be preferably used.

<Formation of Crystalline Cobalt Silicide Film>

In the method for forming a crystalline cobalt silicide film according to the present invention, first, the above-mentioned composition is applied on a surface made of silicon to form a coated film.

The present inventors have found that formation of a crystalline cobalt silicide by the composition depends on chemical composition of a silicon surface to which the composition is applied.

When a coated film formed by applying the composition on a clean silicon surface is heated as mentioned below, a two-layer film containing a layer composed of a crystalline cobalt silicide film having firm adhesion is formed. In contrast, when a coated film formed by applying the composition on a surface having a thin film of silicon oxide formed thereon is heated as mentioned below, a two-layer film is not formed. The present inventors estimate that the phenomenon is caused by a mechanism in which a crystalline cobalt silicide is formed from the composition. Thus, cobalt atoms in a coated film formed on a clean silicon surface diffuse in the depth direction of the silicon surface to form a cobalt silicide, together with silicon atoms existing in the deep region (therefore, a crystalline cobalt silicide film is formed by so-called "eroding" of the silicon surface, and is formed up to the position deeper than the initial silicon surface). However, in a coated film formed on a surface having a thin film of silicon oxide formed thereon, since diffusion of cobalt atoms is blocked by the thin film of silicon oxide, a single layer film maintaining an abundance ratio (Co:Si) of cobalt atoms to silicon atoms in the composition is formed and a cobalt silicide film is not formed (therefore, the single layer film in this case is formed only on a position above the initial silicon surface). It is considered that the single layer film contains silicon atoms, oxygen atoms, carbon atoms and cobalt atoms.

Surprisingly, the diffusion of cobalt atoms in a coated film formed on a clean silicon surface into silicon is also seen when the abundance ratio of Co:Si in a composition agrees with the chemical composition of a cobalt silicide.

Accordingly, when a crystalline cobalt silicide film is formed on the whole surface of a silicon surface, the silicon surface is preferably cleaned by removing a natural oxide film from the silicon surface in advance. The removal of the natural oxide film can be carried out, for example, by bringing the silicon surface into contact with an aqueous solution of hydrofluoric acid.

By employing the dependency on the chemical composition of a surface as mentioned above, it is possible to form a two-layer film containing a layer composed of a patterned crystalline cobalt silicide film having a desired pattern easily on a surface made of silicon. Thus, by providing a partial region of a surface made of silicon, on which a composition is applied, with a thin film of silicon oxide, it is possible to form a single layer film on the partial region and to selectively form a two-layer film including a layer composed of a crystalline cobalt silicide film only on a region other than the partial region. As mentioned above, since the crystalline cobalt silicide film is formed up to a position deeper than the initial silicon surface, a surface having a pattern made of silicon and a crystalline cobalt silicide can be formed easily by removing a surface corresponding to the thickness of a single layer film formed only on a portion above the initial silicon surface. A single layer film formed on a thin film of silicon oxide may contain microcrystalline particles of a cobalt silicide depending on a Co:Si ratio in the composition for application to be used. However, an influence is not exerted on formability of the pattern.

In order to provide a partial region of a surface made of silicon with a thin film of silicon oxide, for example, it is possible to use a method in which only a partial region of a natural oxide film formed on a silicon surface is removed, a method in which the whole surface of a silicon surface is once cleaned before a thin film of silicon oxide is formed only on a partial region of the cleaned surface, and the like.

In order to remove only a partial region of a natural oxide film, for example, it is possible to use a method in which photolithography is applied to a silicon surface having a natural oxide film formed on the whole surface and a coated film of a suitable resist material is formed on a partial region of the surface, and then the surface is brought into contact with an aqueous solution of hydrofluoric acid and the resist material is peeled off.

It is possible to form a thin film of silicon oxide only on a partial region of a clean silicon surface, for example, by a method in which a composition containing a silicon oxide precursor is prepared and the composition is pattern-applied on a clean surface, and then the pattern-applied composition is heated or irradiated with light in air; a method in which the composition is applied on the whole surface of a clean surface and then the composition is pattern-wise irradiated with light in air. Examples of the silicon oxide precursor include a compound represented by the above formula (1A) or (1B), and a solution prepared by dissolving such a compound in a suitable organic solvent can be used as a composition containing the silicon oxide precursor. For pattern-application of such a composition, for example, an ink-jet method can be used. Alternatively, it is possible to use a method in which the composition is pattern-wise stamped using a stamp having a convex surface corresponding to a desired pattern and the like. The heating may be carried out, for example, at 300 to 500° C., for example, for about 0.5 to 30 minutes. In the light irradiation, light having a wavelength of 170 to 600 nm can be used.

A composition obtained by mixing a silane compound with a zero-valent cobalt complex is preferably applied on the thus obtained cleaned silicon surface or silicon surface having a thin film of silicon oxide only on a partial region.

There is no particular limitation on the method of applying a composition, and it is possible to apply the composition, for example, by a spin coating method, a dip coating method, a curtain coating method, a roll coating method, a spray coating method, an ink-jet method, a printing method and the like. The application may be carried out once or applied plural times.

A coated film is formed on a surface made of silicon by removing a solvent from the coated film after application. The solvent can be removed by an appropriate method. When a spin coating method is employed as an application method, since most of the solvent contained in a composition is vaporized during the application step, the coated film obtained after application of the composition can be subjected to the subsequent heating step as the coated film as it is, without subjecting to a special step of removing the solvent after application of the composition. However, the step of further removing the solvent may be carried out. When another application method is employed, the step of removing the solvent is preferably carried out. The removal of a solvent after application can be carried out by retaining a coated film after application, preferably at a temperature of 50 to 180° C., preferably for 5 to 60 minutes.

Both the application step and solvent removal step are preferably carried out under a non-oxidizing atmosphere.

The thickness of the coated film to be formed is preferably from 5 to 1,000 nm, and more preferably 10 to 200 nm, from the viewpoint of a film quality of a crystalline cobalt silicide film formed.

Next, the coated film thus formed is subjected to the step of heating at 550 to 900° C. The heating temperature is preferably from 600 to 850° C. The heating step may be a one-stage heating step in which only the step of heating at 550 to 900° C. is carried out, or a two- or multi-stage heating step in which the step of heating a coated film at a temperature of lower than 550° C. is carried out before further heating at 550 to 900° C. The heating is preferably carried out in one stage or in two stages.

When the heating is carried out in one stage, the heating time at 550 to 900° C. is preferably from 1 to 120 minutes, and more preferably from 10 to 60 minutes. The pressure in case of heating is preferably from $1 \times 10^6$ to $1 \times 10^{-5}$ Pa, and more preferably from $1 \times 10^5$ to $1 \times 10^{-2}$ Pa.

In contrast, when the heating is carried out in two stages, the heating temperature in the first stage heating step is preferably from 200 to 500° C., and more preferably from 300 to 400° C. The heating time in the first stage is preferably from 1 to 120 minutes, and more preferably from 5 to 30 minutes. The pressure during the first stage heating is preferably from $1 \times 10^5$ to $1 \times 10^{-2}$ Pa. The coated film after the first stage heating is then heated at 550 to 900° C., and preferably at 600 to 850° C. The heating time in the second stage is preferably from 1 to 120 minutes, and more preferably from 5 to 60 minutes. The pressure during the second stage heating is preferably from $1 \times 10^6$ to $1 \times 10^{-5}$ Pa, and more preferably from $1 \times 10^5$ to $1 \times 10^{-2}$ Pa.

All of the heating steps are preferably carried out under a non-oxidizing atmosphere. The non-oxidizing atmosphere can be achieved by carrying out the above operations, for example, in an inert gas or in a mixed gas of an inert gas with a reducing gas. Examples of the inert gas include nitrogen, helium, argon and the like, and examples of the reducing gas include hydrogen, carbon monoxide and the like. Of these gases, an inert gas is preferred, and nitrogen or argon is particularly preferred. Nitrogen or argon to be used is preferably controlled so as to adjust the concentration of oxygen to 10 ppm by volume or less.

[Two-Layer Film]

As mentioned above, a two-layer film composed of a first layer made of a crystalline cobalt silicide on a surface made of silicon, and a second layer containing silicon atoms, oxygen atoms, carbon atoms and cobalt atoms on the first layer is formed.

The cobalt silicide layer of the first layer has the composition of $CoSi_2$ stoichiometrically and also has high crystallinity. When silicon constituting the lower layer has crystallinity, the first layer is a cobalt silicide layer formed by grain growth along its crystal direction. When silicon having high crystallinity is used as silicon constituting the lower layer, a highly crystallized cobalt silicide film can be obtained. In particular, when a surface of single crystal silicon is used as the above surface made of silicon, a film of a single crystal cobalt silicide grown epitaxially along the crystal direction of the single crystal silicon can be obtained. The thickness of the first layer can be from 1 to 500 nm, and particularly from 5 to 200 nm.

The second layer is a layer containing silicon atoms, oxygen atoms, carbon atoms and cobalt atoms. More specifically, detailed analysis by the present inventors revealed that the second layer is a specific layer containing a particulate cobalt silicide in a matrix composed of silicon oxide containing carbon. The particulate cobalt silicide also has crystallinity. The thickness of the second layer can be from 1 to 500 nm, and particularly from 5 to 200 nm.

Further surprisingly, it became apparent that, when a cross-section of a two-layer film is observed by a microscope, the interface between a surface made of silicon and a first layer composed of a crystalline cobalt silicide as well as the interface between the first layer and a second layer containing silicon atoms, oxygen atoms, carbon atoms and cobalt atoms shows a clear boundary having high linearity, and that each layer is a layer having an even film thickness and having a high flatness. In particular, flatness of the interface between the surface made of silicon and the first layer is a great advantage, when compared with a method of forming a cobalt silicide by a conventionally known solid-phase growth method.

By removing the second layer from the two-layer film as mentioned above, a single layer film made of a crystalline cobalt silicide formed on a surface made of silicon can be obtained. However, the two-layer film per se also has unique properties, and can be applied industrially advantageously. That is, since the two-layer film exhibits extremely low electrical resistance and the two-layer film per se exhibits high conductivity, it is possible to apply it in the field of various electrode materials to be used for semiconductor devices.

When a surface made of silicon on which a composition is applied has a thin film of silicon oxide on its partial region, a patterned film can be obtained in which a region of a single layer film and a region of a two-layer film form a pattern. Those skilled in the art will easily understand that such a patterned film also has high industrial usefulness.

[Removal of Second Layer]

In order to remove the second layer from the two-layer film as mentioned above to obtain a single layer film made of a crystalline cobalt silicide formed on a surface made of silicon, for example, methods such as mechanical polishing, chemical mechanical polishing, and chemical etching can be used. From the viewpoint of the flatness of the resulting polished surface and the like, chemical mechanical polishing is preferably used. The chemical mechanical polishing can be carried out according to a known method using an appropriate slurry for chemical mechanical polishing containing appropriate abrasive grains such as silicon oxide particles and cerium oxide particles.

<Crystalline Cobalt Silicide Film>

As mentioned above, a single layer film made of a crystalline cobalt silicide formed on a surface made of silicon can be obtained. This cobalt silicide film has the composition of $CoSi_2$ stoichiometrically and a high crystallinity, and therefore can be suitably applied in electrode materials of semiconductor devices, various electrical contact materials (for example, a source-drain contact of metal-oxide-semiconductor field-effect transistor (MOS-FET) and the like) and the like.

EXAMPLES

Preparation Example 1

Preparation of Composition for Application

All operations in the present Preparation Example were carried out under a nitrogen atmosphere having an oxygen concentration of 1 ppm by volume or less.

A composition for application was prepared by dissolving 0.186 g of cyclopentasilane synthesized according to the method disclosed in JP 2001-262058 A and 1.058 g of octacarbonyldicobalt (manufactured by Kanto Chemical Co., Inc. under the trade name of "cobaltoctacarbonyl") in 3.325 g of toluene.

Example 1

An Si (100) substrate was immersed in a 1% by weight aqueous solution of hydrofluoric acid for 1 minute, washed with ultrapure water and then dried to clean the surface.

In a glove box under a nitrogen environment having an oxygen concentration of 1 ppm by volume or less, the composition for application prepared in the above Preparation Example 1 was applied on the above cleaned silicon substrate using a spin coater under conditions of a rotation speed of 2,000 rpm and a rotation time of 30 seconds, and then heated at 400° C. for 60 minutes under 1 atm. Subsequently, the silicon substrate after application and 400° C. heating was removed from the glove box, and heated using a commercially available rapid thermal annealing (RTA) device at 800° C. for 60 minutes under a pressure of 1 Pa to form a two-layer film on the silicon substrate.

For the two-layer film formed as mentioned above, a transmission electron microscope (TEM) observation of the cross-section, an ultra-sensitive micro region element distribution analysis (EDX) of the TEM image, an electron diffraction analysis and the measurement of specific resistance and sheet resistance were carried out by the following methods.

(1) TEM Observation and EDX Analysis

Samples were prepared using the two-layer film formed as mentioned above and using the following procedures, and the TEM observation and EDX analysis were carried out using the following devices and conditions.

First, a carbon deposited film and an FIB (Focused Ion Beam)-assisted tungsten film were coated on a surface of the two-layer film formed as mentioned above for outermost surface protection, and a small sample piece was then removed by micro sampling. For the small sample piece, thin section preparation was carried out by FIB processing, and reduction of FIB damage and additional thin section preparation were then carried out by Ar ion milling. The TEM observation and EDX analysis were carried out using this thin section as a sample.

[Ion Beam Processing]

Device: Focused ion beam processing device manufactured by Hitachi, Ltd., Model "FB-2000A"

Acceleration voltage: 30 kV

[Ion Milling]

Device: Ion milling device manufactured by GATAN, Inc., Model "PIPS Model-691"

Acceleration voltage: 2 kV

[TEM Observation and EDX Analysis]

Device: Field-emission transmission electron microscope manufactured by JEOL Ltd., Model "JEM-2100F" and energy dispersive X-ray spectrometer manufactured by JEOL Ltd., Model "ED-2300T"

Acceleration voltage: 200 kV

Observation direction: Si substrate (110) direction

Beam diameter: φ about 1 nm

A TEM image at a magnification of 50,000 times and a TEM image at a magnification of 500,000 times obtained as mentioned above are shown in FIG. 1(a) and FIG. 1(b), respectively.

Referring to these drawings, it was found that both the interface between the surface of a silicon substrate and the first layer and the interface between the first layer and the second layer show a clear boundary having a high linearity, and that each layer is a layer having an even film thickness and having a high flatness.

Also, an EDX spectrum of the first layer and an EDX spectrum of the second layer obtained as mentioned above are shown in FIG. 2(a) and FIG. 2(b), respectively.

Referring to FIG. 2(a), it was found that the composition of the first layer is almost stoichiometrically $CoSi_2$, while the composition of the second layer contains silicon atoms, carbon atoms, oxygen atoms and cobalt atoms in an atom ratio of Si:C:O:Co=0.362:0.284:0.281:0.074.

(2) Electron Diffraction Analysis

For the first layer and a blackish portion in the second layer of the two-layer film formed as mentioned above, electron diffraction analysis was carried out using the following device and conditions.

Device: Field-emission transmission electron microscope manufactured by JEOL Ltd., Model "JEM-2100F" and CCD camera manufactured by GATAN, Inc., Model "ES500 W"

Acceleration voltage: 200 kV

Beam diameter: ϕ several tens nm

An electron diffraction image of the first layer and an electron diffraction image of a blackish portion in a TEM image of the second layer obtained as mentioned above are shown in FIG. 3(a) and FIG. 3(b), respectively. Also, plane distances and plane angles calculated from the electron diffraction images of these portions are shown in Table 1, together with theoretical values.

TABLE 1

| | Measured values Plane distance (nm) | | Theoretical values | | |
|---|---|---|---|---|---|
| | A ($CoSi_2$) | B ($CoSi_2$) | Plane distance (nm) | Index | Incidence azimuth |
| 1 | 0.267 | 0.269 | 0.268 | 002 | −110° |
| 2 | 0.311 | 0.311 | 0.310 | 111 | |
| 3 | 0.310 | 0.311 | 0.310 | 11-1 | |
| ∠1-2 | 55.1° | 55.2° | 54.74° | A = 0.5364 nm | |
| ∠2-3 | 71.0° | 70.5° | 70.53° | Space group: Fm-3 m (225) | |

Each of FIGS. 3(a) and 3(b) shows a pattern following the theory of a single crystal of $CoSi_2$, and both the plane distances and plane angles in Table 1 show a good agreement with the theoretical values of a single crystal of $CoSi_2$. Thus, it was found that both the first layer and the blackish portion in the second layer are composed of a single crystal of $CoSi_2$. From these results, it is estimated that the second layer contains a cobalt silicide in a matrix composed of silicon oxide containing carbon.

(3) Measurements of Specific Resistance and Sheet Resistance

For the two-layer film formed as describe above, specific resistance and sheet resistance were measured using the following device and conditions.

Device: Low resistivity meter manufactured by Mitsubishi Chemical Corp., Model "Loresta-EP MCP-T360"

Resistivity correction factor RCF: 4.532

Sample size: 2 cm×2 cm

As a result, specific resistance of the two-layer film was 29.5 μΩ·cm, and sheet resistance was 1.31Ω/□ (ohm/square).

Example 2

A two-layer film was formed on a silicon substrate in the same manner as in Example 1, except that the heating temperature under a pressure of 1 Pa in Example 1 was changed to 700° C.

For the two-layer film formed here, specific resistance measured in the same manner as in Example 1 was 33.5 μΩ·cm, and sheet resistance was 2.91 Ω/□.

Example 3

A two-layer film was formed on a silicon substrate in the same manner as in Example 1, except that the heating temperature under a pressure of 1 Pa in Example 1 was changed to 900° C.

For the two-layer film formed here, specific resistance measured in the same manner as in Example 1 was 56.5 μΩ·cm, and sheet resistance was 3.53 Ω/□.

Example 4

Influence of Heating Temperature

An Si (100) substrate was immersed in a 1% by weight aqueous solution of hydrofluoric acid for 1 minute, washed with ultrapure water and then dried to clean the surface. In the same manner, 6 hydrofluoric acid-treated Si (100) substrates were obtained.

The composition for application prepared in Preparation Example 1 was applied on each of the substrates in a glove box in the same manner as in Example 1, and then heated at 400° C. for 60 minutes. Subsequently, each substrate after the above application and 400° C. heating was removed from the glove box. Five of these substrates were heated using a commercially available RTA device at heating temperatures of 500° C., 600° C., 700° C., 800° C. and 900° C., respectively, for 60 minutes under a pressure of 1 Pa to form two-layer films different in heating temperature on 5 substrates, respectively. The remaining one substrate was subjected to the following X-ray diffraction analysis as it is, without carrying out the heating under a pressure of 1 Pa.

For the first layer in these two-layer films, X-ray diffraction analysis was carried out using the following device and conditions.

Device: X-ray diffraction device manufactured by MAC Science Ltd., Model "M18XHF-SRA"

Radiation source: Copper

Sample size: 2 cm×2 cm

Voltage and current: 40 kV, 60 mA

Measurement range: 20-80°

Scan speed: 5°/minute

FIGS. 4(a) and 4(b) show a chart in a range of 2θ=32-35° and a chart in a range of 2θ=67-73°, respectively.

Referring to FIGS. 4(a) and 4(b), it was found that the first layer hardly shows crystallinity when heated at 500° C. under a pressure of 1 Pa but shows crystallinity when the heating temperature exceeds 500° C. Also, it was found that the first layer is obtained by epitaxial crystal growth following the crystal direction of an underlying silicon substrate.

Example 5

Removal of Second Layer from Two-Layer Film

A two-layer film was formed on a silicon substrate in the same manner as in Example 1.

The second layer of the two-layer film on a silicon substrate was removed by chemical mechanical polishing (CMP) under the following conditions to obtain a cobalt silicide single layer film on a silicon substrate.

Polishing device: Model "MA-200D" manufactured by Musashino Electron Corp.

Polishing pad: Trade name "SURFIN XXX-5" manufactured by Fujimi Inc.

Aqueous dispersion for chemical mechanical polishing: Trade name "Slurry for oxide polishing S31-D08" manufactured by JSR Corp.

Plate rotation frequency: 60 rpm
Polishing time: 3 minutes

The cobalt silicide single layer film on a silicon substrate obtained as mentioned above was evaluated as follows.

(1) Scanning Electron Microscope (SEM) Observation of Cross Section

In this Example, SEM observation of each cross-section of samples before and after CMP was carried out using the following device and conditions.

Device: Scanning electron microscope manufactured by Hitachi High-Technologies Corp., Model "S4800 type"
Acceleration voltage: 1.5 kV A cross-sectional SEM image before CMP and a cross-sectional SEM image after CMP are shown in FIG. 5(a) and FIG. 5(b), respectively. From these cross-sectional SEM images, it was confirmed that only the second layer (upper layer) of the two-layer film could be removed by the above CMP.

(2) Measurement of Specific Resistance and Measurement of Sheet Resistance

For the film (single layer film of crystalline cobalt silicide) after the above CMP, specific resistance measured in the same manner as in Example 1 was 18.1 μΩ·cm, and sheet resistance was 4.22 Ω/□.

Reference Example 1

Film Formation on Naturally Oxidized Film

A film was formed on a silicon substrate in the same manner as in Example 1, except that an Si (111) substrate was used as a substrate, and cleaning of an upper surface of the substrate by an aqueous solution of hydrofluoric acid was not carried out. The substrate used here was a silicon substrate having a natural oxide film on its whole surface.

A cross-section TEM image (at a magnification of 500,000 times) of the film formed as mentioned above, which was taken in the same manner as in Example 1, is shown in FIG. 6. Referring to the photograph, it was found that a single layer film is formed on only a portion above the natural oxide film (shown by "SiO$_2$" in FIG. 6) in this Reference Example.

Example 6

Formation of Patterned Film

A resist pattern as shown in FIG. 7 was formed by photolithography on an Si (100) substrate having a natural oxide film on the whole surface. In FIG. 7, portions colored in gray are regions having a resist film. FIG. 7(a) is a view showing the whole region of the resist pattern, and FIG. 7(b) is a partially enlarged view of the region surrounded by dashed line in FIG. 7(a). In a line and space pattern region (shown by "strip line" in FIG. 7(a) of this resist pattern, line width H is 30 μm, gap width G is 3 μm, and lengths W, L and D are 459 μm, 490 μm and 10 μm, respectively. The substrate having this resist pattern was immersed in a 1% by weight aqueous solution of hydrofluoric acid for 1 minute, washed with ultrapure water, and then dried. Subsequently, the resist is broken off using a remover, and the substrate was washed with ultrapure water and dried to form a pattern composed of a region having a natural oxide film and a region not having the natural oxide film on the Si substrate.

In a glove box under a nitrogen environment having an oxygen concentration of 1 ppm by volume or less, the composition for application prepared in Preparation Example 1 was applied on the above substrate using a spin coater under conditions of a rotation speed of 2,000 rpm and a rotation time of 30 seconds, and then heated at 400° C. for 60 minutes under 1 atm. Subsequently, the silicon substrate after the above application and 400° C. heating was removed from the glove box, and heated using a commercially available RTA device at 800° C. for 60 minutes under reduced pressure of 1 Pa to form a film on the silicon substrate.

An optical micrograph of the film formed here is shown in FIG. 8. The micrograph region in FIG. 8 corresponds to a region surrounded by dashed-dotted line in FIG. 7(b).

Referring to FIG. 8, it is understood that a film on the region not having a natural oxide film and a film on the region having the natural oxide film on the Si substrate form a pattern. When combining the photograph of FIG. 7 with the results of Examples 1 to 5 and Reference Example 1, it is considered that the film formed in this Example is a patterned film composed of a two-layer film on the region not having a natural oxide film and a single layer film on the region having the natural oxide film on the Si substrate.

Also, as mentioned in "Description of Embodiments", a crystalline cobalt silicide film which is the first layer in the two-layer film is formed up to a position deeper than the initial silicon surface, and therefore, a surface having a fine pattern composed of silicon and a crystalline cobalt silicide can be formed by removing a surface corresponding to the thickness of a film formed only on a portion above the initial silicon surface, in the patterned film formed in this Example.

INDUSTRIAL APPLICABILITY

According to the method of the present invention, a crystalline cobalt silicide film can be formed easily, rapidly and inexpensively, on a surface made of silicon in a simple manner.

The crystalline cobalt silicide film formed by the method of the present invention is excellent in crystallinity and conductivity, and is therefore best suited for use as an electrode material for semiconductor devices and also can be suitably used as various electrical contact materials.

In addition, a two-layer film produced during the process of forming a crystalline cobalt silicide film by the method of the present invention is excellent in conductivity in itself, and therefore, can be suitably used in various electrode materials to be used for semiconductor devices and the like.

The invention claimed is:

1. A method for forming a crystalline cobalt silicide film, comprising:
applying to a surface made of crystalline silicon a solution of a compound represented by the following formula (1A) or (1B):

$$Si_nX_{2n+2} \tag{1A}$$

$$Si_mX_{2m} \tag{1B}$$

wherein each X in the formulas (1A) and (1B) is a hydrogen atom or a halogen atom, n is an integer of 1 to 10, and m is an integer of 3 to 10, or a polymer thereof and a zero-valent cobalt complex in an organic solvent to form a coating film;
heating the coated film at 550 to 900° C. so as to form a two-layer film which is composed of a first layer made of a crystalline cobalt silicide on the surface made of silicon and a second layer containing a particulate cobalt silicide in a matrix composed of silicon oxide containing carbon on the first layer; and
removing the second layer of the two-layer film.

2. The method according to claim 1, wherein the crystalline cobalt silicide is a single crystal of cobalt silicide.

3. The method according to claim 2, wherein the surface made of crystalline silicon has a film of silicon oxide in a partial region thereof, and the crystalline cobalt silicide film to be formed is a patterned crystalline cobalt silicide film.

4. The method according to claim 1, wherein the surface made of crystalline silicon is a surface of a silicon substrate.

5. The method according to claim 4, wherein the surface made of crystalline silicon has a film of silicon oxide in a partial region thereof, and the crystalline cobalt silicide film to be formed is a patterned crystalline cobalt silicide film.

6. The method according to claim 1, wherein the surface made of crystalline silicon has a film of silicon oxide in a partial region thereof, and the crystalline cobalt silicide film to be formed is a patterned crystalline cobalt silicide film.

7. The method according to claim 1, further comprising cleaning the surface of crystalline silicon prior to applying the solution.

8. The method according to claim 1, wherein the first layer has a thickness of from 1 to 500 nm and the second layer has a thickness of from 1 to 500 nm.

9. A method for forming a two-layer film, comprising:
applying to a surface made of crystalline silicon a solution of a compound represented by formula (1A) or (1B):

$$Si_nX_{2n+2} \quad (1A)$$

$$Si_mX_{2m} \quad (1B)$$

wherein each X in the formulas (1A) and (1B) is a hydrogen atom or a halogen atom, n is an integer of 1 to 10, and m is an integer of 3 to 10, or a polymer thereof and a zero-valent cobalt complex in an organic solvent to form a coating film; and
heating the coated film at 550 to 900° C. so as to form the two-layer film, which comprises a first layer made of a crystalline cobalt silicide on the surface made of crystalline silicon and a second layer containing a particulate cobalt silicide in a matrix composed of silicon oxide containing carbon on the first layer.

10. The method according to claim 9, wherein the first layer made of the crystalline cobalt silicide is a layer made of a single crystal of cobalt silicide.

11. The method according to claim 10, wherein the surface made of crystalline silicon has a film of silicon oxide in a partial region thereof, and the two-layer film to be formed is a patterned two-layer film.

12. The method according to claim 9, wherein the surface made of crystalline silicon is a surface of a silicon substrate.

13. The method according to claim 12, wherein the surface made of crystalline silicon has a film of silicon oxide in a partial region thereof, and the two-layer film to be formed is a patterned two-layer film.

14. The method according to claim 9, wherein the surface made of crystalline silicon has a film of silicon oxide in a partial region thereof, and the two-layer film to be formed is a patterned two-layer film.

15. The method according to claim 9, further comprising cleaning the surface of crystalline silicon prior to applying the solution.

16. The method according to claim 9, wherein the first layer has a thickness of from 1 to 500 nm and the second layer has a thickness of from 1 to 500 nm.

* * * * *